United States Patent
Malhan et al.

(10) Patent No.: US 7,141,498 B2
(45) Date of Patent: Nov. 28, 2006

(54) METHOD OF FORMING AN OHMIC CONTACT IN WIDE BAND SEMICONDUCTOR

(75) Inventors: Rajesh Kumar Malhan, Nagoya (JP); Yuichi Takeuchi, Obu (JP); Irina Nikitina, Wallsend (GB); Konstantin Vassilevski, Wallsend (GB); Nicholas Wright, Newcastle (GB); Alton Horsfall, Tyne and Wear (GB)

(73) Assignees: Denso Corporation, Kariya (JP); The University of Newcastle upon Tyne, Newcastle upon Tyne (GB)

( * ) Notice: Subject to any disclaimer, the term of this patent is extended or adjusted under 35 U.S.C. 154(b) by 0 days.

(21) Appl. No.: 11/159,264

(22) Filed: Jun. 23, 2005

(65) Prior Publication Data

US 2006/0205195 A1    Sep. 14, 2006

(30) Foreign Application Priority Data

Mar. 14, 2005    (GB)    ................... 0505213.9

(51) Int. Cl.
*H01L 21/44*    (2006.01)

(52) U.S. Cl. ...................... 438/682; 438/570; 438/571; 438/572; 438/575; 438/581; 257/E21.062

(58) Field of Classification Search ................ 438/570, 438/571, 572, 575, 581, 682
See application file for complete search history.

(56) References Cited

U.S. PATENT DOCUMENTS

| | | | |
|---|---|---|---|
| 3,767,482 A | | 10/1973 | Kock et al. |
| 4,620,361 A | * | 11/1986 | Matsukawa et al. ........ 438/257 |
| 6,110,813 A | * | 8/2000 | Ota et al. .................... 438/597 |
| 6,759,683 B1 | * | 7/2004 | Cole et al. ..................... 257/77 |
| 6,803,243 B1 | | 10/2004 | Slater, Jr. et al. |
| 2003/0203603 A1 | | 10/2003 | Meier et al. |
| 2004/0185643 A1 | | 9/2004 | Chiyo et al. |
| 2005/0116230 A1 | * | 6/2005 | Cabral et al. ................ 257/69 |

FOREIGN PATENT DOCUMENTS

| | | |
|---|---|---|
| JP | A-S63-5519 | 1/1988 |
| JP | A-2002-016013 | 1/2002 |
| WO | WO 2004/025709 A3 | 3/2004 |

OTHER PUBLICATIONS

S.M. Gasser; A. Bachli; E. Kolawa; M.A. Nicolet, Reaction sequence of thin Ni films with (001) 3C-SiC, Materials for Advanced Metallization, 1997, p. 191.*
Sung-Mo Kang; Yusuf Leblebici, CMOS Digital Integrated Circuits, McGraw-Hill, 3rd Editioin, pp. 53-56.*
S. Y. Han, J.-Y. Shin, B.-T. Lee, and J.-L. Lee, J. Vac. Sci. Technol. B 20, 1496 (2002).*
Mohney et al., "Morphological study of the Al-Ti ohmic contact to p-type SiC" *Solid-State Electronics*, 2002, pp. 689-693.

* cited by examiner

*Primary Examiner*—Michelle Estrada
*Assistant Examiner*—Jarrett J Stark
(74) *Attorney, Agent, or Firm*—Posz Law Group, PLC

(57) ABSTRACT

A method of forming an ohmic contact on a substrate composed of a wide-band gap semiconductor material includes: depositing a transition metal group metal on the substrate; annealing the substrate at a high temperature to cause a solid state chemical reaction between the substrate and the deposited metal that forms a modified layer in the substrate having modified properties different than the substrate, and by-products composed of a silicide and a nanocrystalline graphite layer; selectively etching the substrate to remove one or more of the by-products of the solid state chemical reaction from a surface of the substrate; and depositing a metal film composed of a transition group metal over the modified layer on the substrate to form the ohmic contact. The modified layer permits formation of the ohmic contact without high temperature annealing after depositing the metal film.

4 Claims, 6 Drawing Sheets

METHOD OF FORMING AN OHMIC CONTACT IN WIDE BAND SEMICONDUCTOR

CROSS REFERENCE TO RELATED APPLICATION

This application is based upon, claims the benefit of priority of, and incorporates by reference the contents of GB Patent Application No. 0505213.9 filed on Mar. 14, 2005.

FIELD OF THE INVENTION

The present invention relates generally to a method of forming a semiconductor device, and, more particularly, to a method of forming an ohmic contact for a semiconductor device.

BACKGROUND OF THE INVENTION

A semiconductor device requires a good ohmic contact to permit efficient transfer of electricity from external wires to the device. The metal ohmic contact must be physically and chemically compatible with the semiconductor material of the device. An ohmic contact is usually defined as a metal-semiconductor contact that has negligible contact resistance relative to the bulk or spreading resistance of the semiconductor (Physics of Semiconductor Devices by Sze, Second Edition, 1981).

In wide band semiconductor device such as, for example, silicon carbide devices, limited electrical conductivity of the semiconductor due to low hole or electron concentrations may hinder or even prevent the formation of an ohmic contact. Therefore, the formation of low resistivity and thermally stable ohmic contacts to silicon carbide is one of the most critical stages in device processing. A general approach to this problem and an overview of the main results has been published by Crofton et al. in (Phys. Status Solidi B 202, (1997) 581).

Ohmic contacts to silicon carbide are typically formed by the deposition of transition metals (possibly in combination with other metals) onto heavily doped silicon carbide followed by high temperature annealing. This high temperature of annealing (typically in excess of 900 degrees Celsius) may negatively affect other component parts of the device.

SUMMARY OF THE INVENTION

One approach to avoid the affects of high temperature ohmic contact annealing induced problems would be to form an ohmic contact on the substrate prior to other device processing necessary for the other component parts or to complete the semiconductor device. However, this approach is not practical because it inserts an undesired contact metal contaminant having metal impurities that can degrade the device electrical properties.

For example, many semiconductor devices such as MOSFETs require a layer of gate thermal oxide. The high temperatures associated with traditional ion implantation techniques or contact metal annealing processes place high stress on oxide layers, which can damage oxide layers and the semiconductor-oxide interface. Further, forming the ohmic contact prior to creating the oxide layer is not practical because the oxidizing environment utilized to form the oxide layer has adverse effects on the ohmic contact. Therefore, a need exists for a practical method for forming an ohmic contact for use in conjunction with a semiconductor device that does not exhibit the above manufacturing problems.

In view of the above concerns, the present inventors have discovered a novel method of forming such ohmic contacts that facilitates the protection of other sensitive components. The method comprises a multi-stage ohmic contact formation procedure where the initial high temperature stage may be separated in time or by other processes from the subsequent low temperature stage or even room temperature stage. This novel method is useful in making a ohmic contact utilizing n-type as well as p-type silicon carbide. However, this novel method may also be adapted for use with other wide band gap semiconductor materials such as II-V GaN, Diamond, etc.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1A:
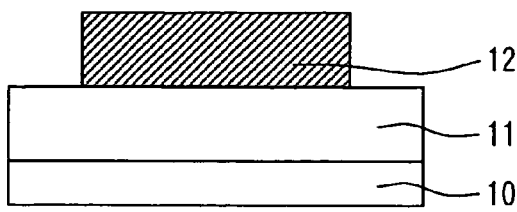
FIGS. 1A–1D show a method of forming an ohmic contact on a semiconductor substrate according to a first embodiment.

Referring now to the drawings in which like numerals reference like parts, preferred embodiments of a method of forming an ohmic contact on a semiconductor substrate will be discussed.

Referring to FIGS. 1A–1D, a first embodiment will be discussed. Referring first to FIG. 1A, a metal 12 selected from transition group metals is deposited on a silicon carbide epi-wafer substrate. The substrate of this embodiment includes a thin silicon carbide layer 11 on a crystalline silicon wafer 10. For example, the semiconductor wafer 10 may be a silicon carbide wafer having a carbon-faced surface and a silicon-faced surface. The silicon carbide wafer may have an on-axis, an eight degree off-axis, a three and one half degree off-axis and four degree off-axis wafer surface. However, generally the wafer 10 is any wide-band gap semiconductor material such as III-V GaN, diamond, etc. The wafer 10 may be a bare n-type conductivity silicon carbide wafer or a silicon carbide wafer with multiple epitaxial layers with conductivity of any type, having an n-type conductivity top epitaxial layer as the thin layer 11. The top epitaxial layer 11 may possess an initial dopant concentration from about $1.0 \times 10^{17}$ $cm^{-3}$ or higher. The epi-wafer substrate may be either 2H, 6H, 4H or 15R polytype with any crystallographic orientation.

The wafer 10 and the top thin layer 11 will both be referred to hereafter as a substrate 10 for simplicity.

The metal 12 deposited on the substrate 10 in this embodiment is composed of Nickel. However, the metal may be any metal selected from the transition metal group consisting of Nickel (Ni), Titanium (Ti), Cobalt (Co), Tungsten (W), and Molybdenum (Mo). The metal 12 may also be a combination of metals from this group. The metal 12 may have a predetermined thickness between 50 and 5000 Angstroms or, more preferably, between 500 and 1000 Angstroms, in order to manipulate a solid state chemical reaction that will be discussed further below.

The metal 12 may be deposited by any suitable technique such as sputtering, e-beam evaporation, or thermal evaporation. However, the metal is preferably deposited by DC Magnetron Sputtering because of the advantages of excellent control and experimental flexibility in an established industrial process suitable for high area, high quality film deposition.

The contact geometry for depositing the metal is defined by any patterning technique (e.g. UV photolithography and metal etching).

Figure 1B:
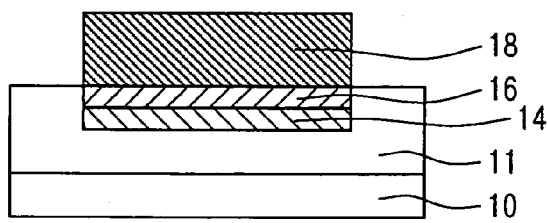

Referring to FIG. 1B, the substrate 10 is annealed at a high temperature to cause a solid state chemical reaction between the substrate 10 and the deposited metal 12 that forms a modified layer 14 in the substrate 10 having modified properties different than the substrate 10. The solid state chemical reaction also form by-products comprised of a transition metal silicides (e.g. $Ni_2Si$) which will be referred to generally as silicide 18 and a nanocrystalline graphite layer 16. The high temperature may be between 700 and 1300 degrees Celsius. However, as discussed later, the high temperature is more preferably between 900 and 1100 degrees Celsius.

As mentioned above, the metal 12 may have a predetermined thickness between 50 and 5000 Angstroms or, more preferably, between 500 and 1000 Angstroms, in order to manipulate the solid state chemical reaction. More particularly, the solid state chemical reaction can be tailored for different doping concentrations of epi-wafers by controlling the thickness of the metal 12, thermal annealing temperature, and annealing time.

Figure 1C:
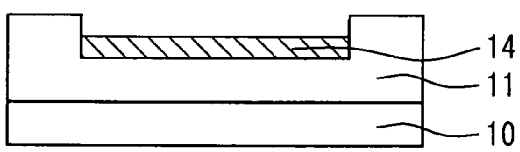

Referring to FIG. 1C, the substrate 10 is selectively etched to remove the by-products of the solid state chemical reaction from a surface of the substrate 10. More particularly, the silicide 18 and the nanocrystalline graphite layer 16 are removed. The selective etching may be performed by a treatment in liquid or gaseous etchants.

After removing the by-products, a device formation process can be performed here to form other component parts for a device such as a MOSFET or IGBT or to complete the semiconductor device. Here, formation of parts on the substrate 10 that are sensitive to heat or the presence of a metal contact may be performed. For example, here a thermal oxide growth process can be performed for forming a gate.

Figure 1D:
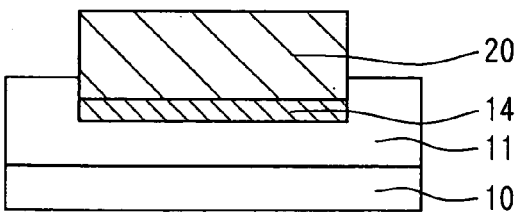

Next, as shown in FIG. 1D a metal film 20 comprised of a transition group metal is deposited on the modified layer 14 to form the ohmic contact. The contact geometry for depositing the metal film 20 may be defined by any suitable patterning method. The modified layer 14 permits formation of the ohmic contact without high temperature annealing after depositing the metal film 20. For example, the deposition of the metal film 20 may be at room temperature.

A low temperature anneal (below 600 degrees Celsius) may be performed at this stage to promote good interface contact even though the deposited metal yields a good ohmic contact.

Therefore, in the method according to the first embodiment, the modified silicon carbide layer 14 permits formation of the ohmic contact without requiring a high temperature annealing process and even at room-temperature. In the conventional approach the ohmic contacts are formed during high-temperature annealing because of a change of the electrical properties of the underlying silicon carbide, rather than because of the presence of products of solid state chemical reaction between transition metal and silicon carbide. As discussed above, annealing the deposited metal 12 modifies properties of the underlying silicon carbide.

Figure 2A:
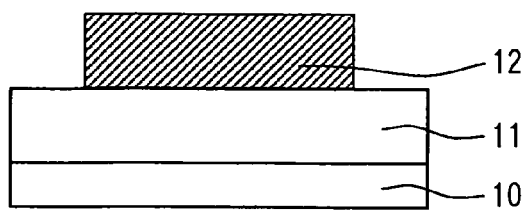
FIGS. 2A–2D show a method of forming an ohmic contact on a semiconductor substrate according to a second embodiment.
Figure 2B:
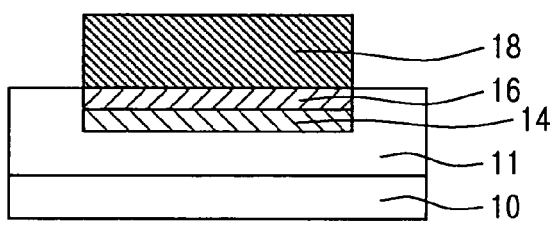

Referring to FIGS. 2A–2D, a second embodiment will be discussed. Similar to as shown in FIGS. 1A–1B of the first embodiment, here, as shown in FIGS. 2A–2B the transition metal group metal 12 is deposited on the substrate 10, and the substrate 10 is annealed at a high temperature to cause a solid state chemical reaction between the substrate 10 and the deposited metal 12 that forms a modified layer 14 in the substrate 10 having modified properties different than the substrate 10, and by-products comprised of a silicide 18 and a nanocrystalline graphite layer 16.

Figure 2C:
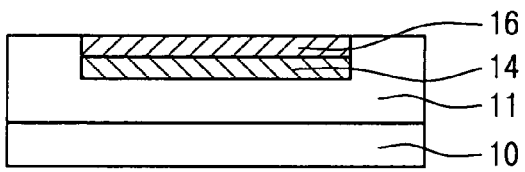

Referring to FIG. 2C, the substrate 10 is selectively etched to remove only the silicide 18. More particularly, the nanocrystalline graphite layer 16, which is also a by-product of the solid state chemical reaction is not removed.

After removing the silicide, a device formation process can be performed here to form parts on the substrate 10 that are sensitive to heat or the presence of a metal contact as discussed above.

Figure 2D:
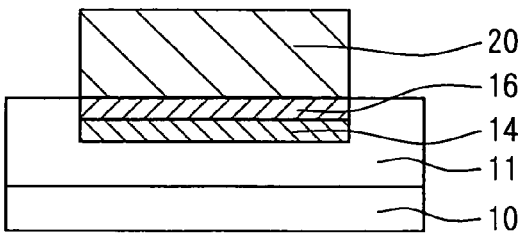

Next, as shown in FIG. 2D, the metal film 20 composed of a transition group metal is deposited on the nanocrystalline graphite layer 16, which is over the modified layer 14 to form the ohmic contact. The contact geometry for depositing the metal film 20 may be defined by any suitable patterning method. The modified layer 14 permits formation of the ohmic contact without high temperature annealing after depositing the metal film 20. For example, the deposition of the metal film 20 may be at room temperature. A low temperature anneal (below 600 degrees Celsius) may be subsequently performed to promote good interface contact even though the deposited metal yields a good ohmic contact.

Therefore, in the method according to the second embodiment, the modified silicon carbide layer 14 permits formation of the ohmic contact without requiring a high temperature annealing process or even at room-temperature and without requiring removal of the nanocrystalline graphite layer 16. As discussed above, annealing the deposited metal 12 modifies properties of the underlying silicon carbide.

In a preferred embodiment, Nickel is used as the transition group metal for the metal 12 and the metal film 20. Nickel is the most widely used transition metal for fabrication of ohmic contacts to n-type silicon carbide. It is well established that nickel silicides are formed during high temperature annealing as a result of silicon carbide dissociation and chemical reaction between Ni and Si. This process starts at temperatures of about 500 degrees Celsius with the creation of nickel-rich silicides followed by formation of less metal-rich silicides at higher temperatures. At temperatures around 1000 degrees Celsius and above only the $Ni_2Si$ phase is present. Another product of the solid state reaction between silicon carbide and Ni during annealing is carbon.

Figure 3:
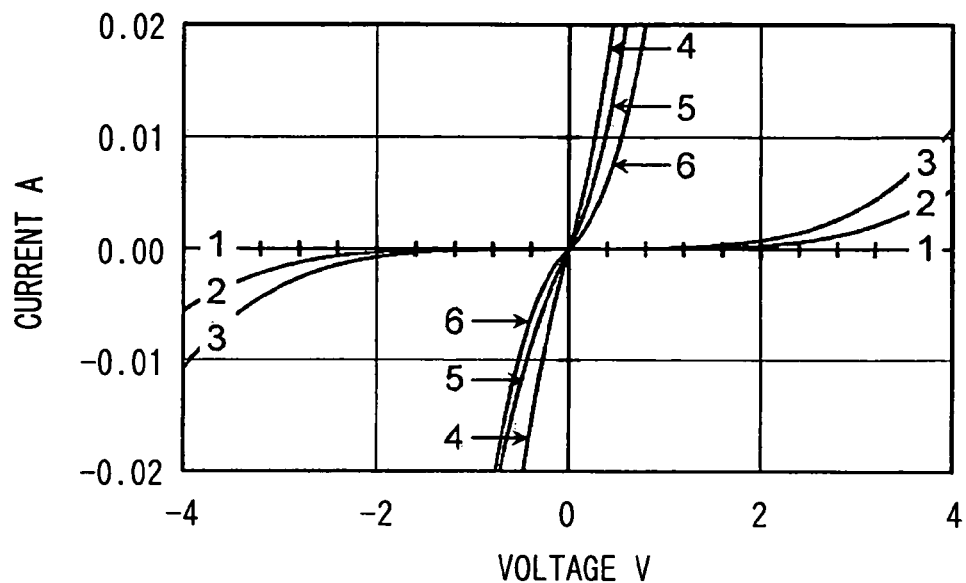
FIG. 3 shows the IV characteristics of Nickel based ohmic contacts to a silicon carbide substrate that were annealed at different temperatures.

Referring to FIG. 3, the I-V characteristics of Ni-based contacts to n-type 4H polytype silicon carbide are shown. The various curves are defined as follows:

(1) as deposited;

(2) after annealing at around 800 degrees Celsius;

(3) after annealing at around 900 degrees Celsius;

(4) after annealing at around 1000 degrees Celsius;

(5) 1000 degrees Celsius annealed sample after $Ni_2Si$ replacement by Ti; and (6) 1000 degrees Celsius annealed sample after $Ni_2Si$ and nanocrystalline graphite replacement by Ti.

Figure 4:
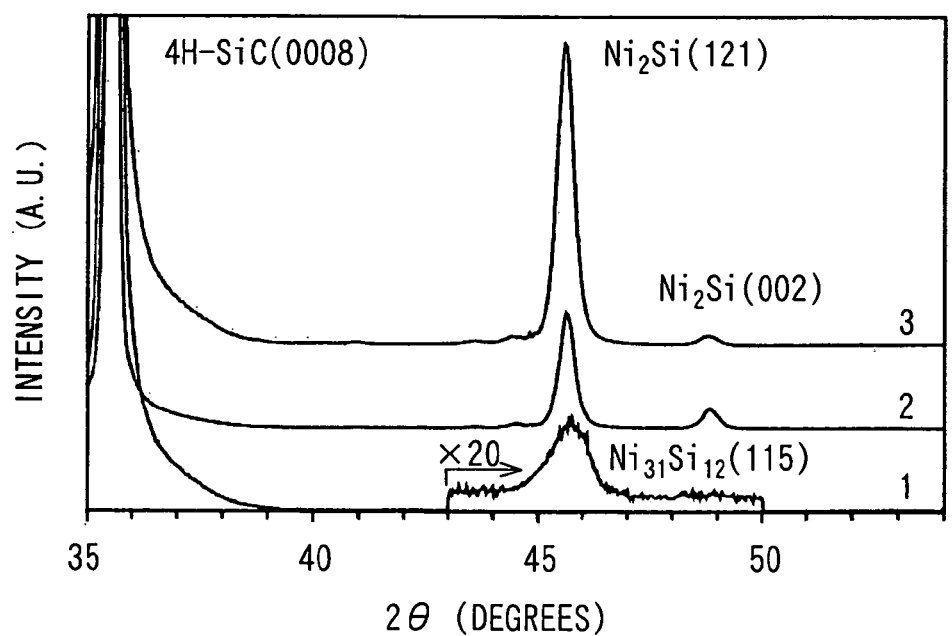
FIG. 4 shows fragments of x-ray diffraction patterns taken from samples that were annealed at different temperatures.

As shown in FIG. 3, the samples annealed around 900 degrees Celsius (curve 3) and around 1000 degrees Celsius (curve 4) have dramatically different electrical characteristics. FIG. 4 shows the x-ray diffraction structural analysis on samples annealed around 800 degrees Celsius (curve 1); around 900 degrees Celsius (curve 2); and around 1000 degrees Celsius (curve 3). As shown in FIG. 4, although samples annealed at 900 and 1000 degrees have dramatically different electrical characteristics, the same samples have very similar $Ni_2Si$ XRD spectra. This confirms that the presence of $Ni_2Si$ does not, in itself, cause a Schottky-ohmic transition in contact behavior. The curve 5 and curve 6 confirm the above mentioned embodiments where contact metal deposition is carried out after removing the various products of the solid state chemical reaction.

Referring again to the x-ray diffraction structural analysis shown in FIG. 4, formation of nickel silicides, as a result of the interaction between Ni and silicon carbide during high temperature annealing, was observed in all samples. However, very weak asymmetrical broadened and overlapping peaks from Ni-rich $Ni_{31}Si_{12}$ and Si-rich $Ni_2Si$ phases were found in XRD pattern of curve 1. An increase of anneal temperature from around 800 to around 900 degrees Celsius resulted in formation of only polycrystalline $Ni_2Si$ as is clear from the XRD pattern curve 2. A further increase of annealing temperature, from 900 to 1000 degrees Celsius, led to higher $Ni_2Si$ peaks in the XRD pattern of curve 3, corresponding to an increase in the relative quantity of $Ni_2Si$ in the contact layer. As mentioned above, this shows that samples annealed around 900 degrees Celsius or around 1000 degrees Celsius have dramatically different electrical characteristics in spite of having very similar $Ni_2Si$ XRD spectra.

Figure 5:
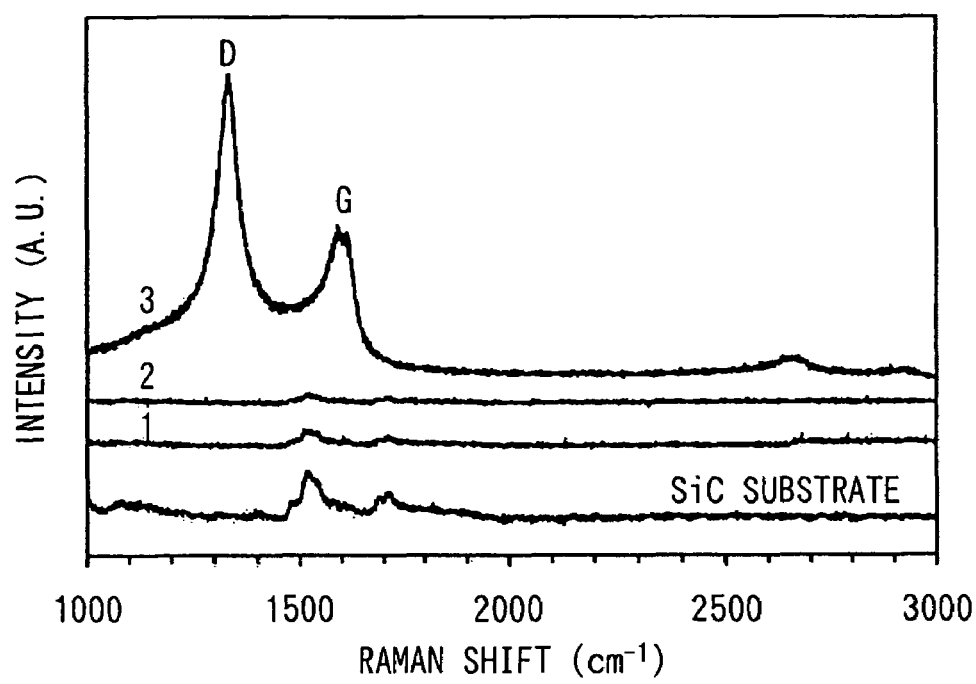
FIG. 5 shows a Raman spectra for contact areas annealed at different temperatures as well as the silicon carbide substrate.

Referring to FIG. 5, the Raman spectra obtained from contact areas of samples annealed at 800 (curve 1), 900 (curve 2), and 1000 degrees Celsius (curve 3) after removal of nickel silicides as well from the silicon carbide substrate are shown. Three intensive and rather broad bands at 1335 $cm^{-1}$, 1590 $cm^{-1}$ and 1620 $cm^{-1}$, as well as a weak band at 2660 $cm^{-1}$, appeared only in the Raman spectrum taken from the sample annealed at 1040 degrees Celsius. These peaks are the first order D-band at 1335 $cm^{-1}$, the G-band at 1590 $cm^{-1}$ and the second order D-band at 1620 $cm^{-1}$ and are associated with different states of carbon films. The weak peak at 2660 $cm^{-1}$ was interpreted as the second order of G-band. All these bands in a Raman spectrum are direct evidence of a carbon film in the form of nanocrystalline graphite with prevalent sp2 bonding.

The ratio of the D peak intensity to that of the G peak I(D)/I(G) varies inversely with the graphite cluster in-plane size. An average size of crystallites $L_a$ can be estimated from the expression $$I(D)/I(G)=C(\lambda)/L_a \tag{1}$$

wherein I(D) and I(G) are the intensities of D- and G-bands respectively and $C(\lambda) \sim 4.4$ nm for the excitation line $\lambda=515.5$ nm.

The nanocrystalline graphite film on a sample annealed around 1000 degrees Celsius had an average in-plane size of crystallites of about 2.5 nm. In contrast, there were only the weak peaks typical for silicon carbide in the Raman spectra taken from the samples annealed around 800 and 900 degrees Celsius, which indicates a uniformly distributed carbon as a precipitate in the nickel silicide layer. During etching of the nickel silicides, these precipitates would have been mechanically removed.

Collectively, the Raman spectra show that carbon, in the form of a nanocrystalline graphite film located between the $Ni_2Si$ and silicon carbide layers, was created only in the samples annealed at a temperature of 1000 degrees Celsius. This is clear evidence that the character of Ni-silicon carbide interaction at 1000 degrees Celsius is different from that at lower temperatures.

Figure 6A:
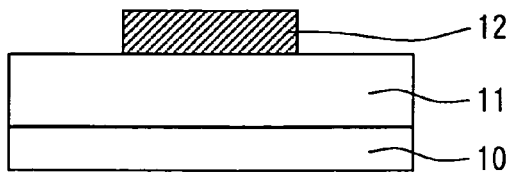
FIGS. 6A–6I show a method of forming an ohmic contact for a MOS based power device according to a third embodiment.
Figure 6F:
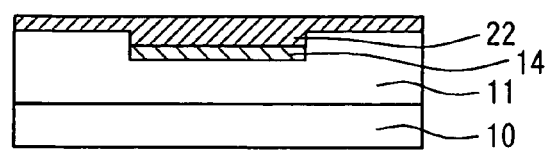
Figure 6B:
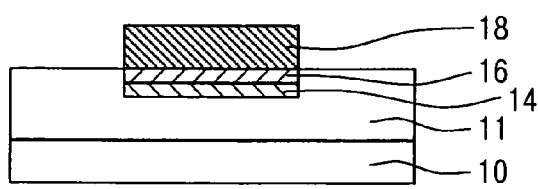

Referring to FIGS. 6A–6I, a third embodiment will be discussed in which a metal-semiconductor contact for MOS based metal-oxide-semiconductor field-effect transistors (MOSFETs) and insulated gate bipolar transistors (IGBTs) is formed. Similarly to as shown in FIGS. 1A–1B of the first embodiment, here, as shown in FIGS. 6A–6B the transition metal group metal 12 is deposited on the substrate 10, and the substrate 10 is annealed at a high temperature to cause a solid state chemical reaction between the substrate 10 and the deposited metal 12 that forms a modified layer 14 in the substrate 10 having modified properties different than the substrate 10, and by-products comprised of a silicide 18 and a nanocrystalline graphite layer 16.

Figure 6G:
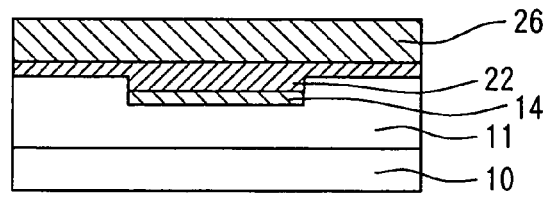
Figure 6C:
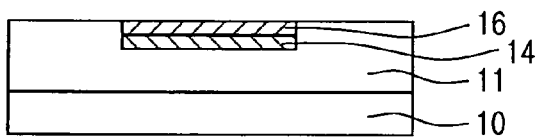

Referring to FIG. 6C, the substrate 10 is selectively etched to remove only the silicide 18. More particularly, the nanocrystalline graphite layer 16, which is also a by-product of the solid state chemical reaction is not removed.

After removing the silicide 18, a device formation process can be performed here to form parts on the substrate 10 that are sensitive to heat or the presence of a metal contact as discussed above.

Figure 6H:
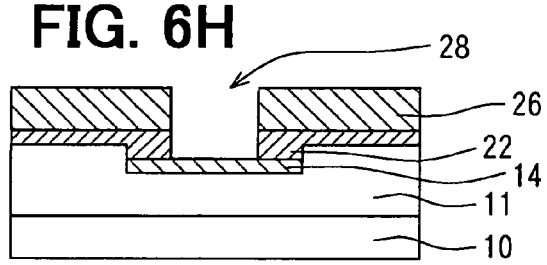
Figure 6D:
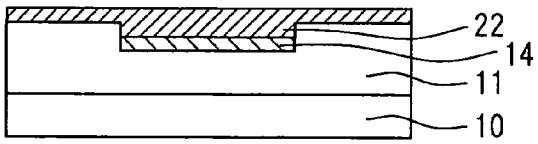

Referring to FIG. 6D, a gate thermal oxidation process is performed here to grow a thermal oxide layer 22 over the modified layer 14 to form a gate (not shown for ease of illustration). The nanocryatalline graphite layer 16 is removed during the oxidation process.

Figure 6I:
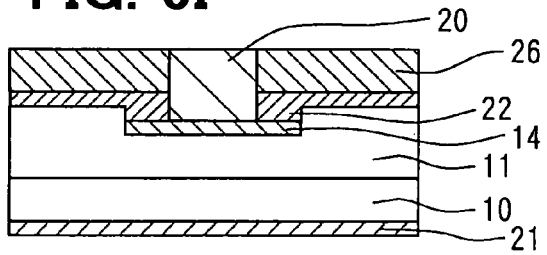
Figure 6E:
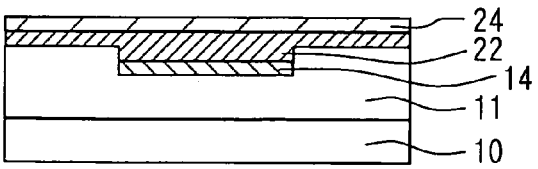

Referring to FIG. 6E, polysilicon 24 is deposited over the thermal oxide layer 22. As shown in FIG. 6F, the polysilicon 24 is selectively removed from the contact area. As shown in FIG. 6G, a passivation layer 26 is deposited over the thermal oxide layer 22. As shown in FIG. 6H, a contact hole 28 is formed in the passivation layer 26 and the thermal oxide layer 22 to expose the modified layer 14. Finally, as shown in FIG. 6I, metal film 20 is deposited in a contact hole 28 in the thermal oxide layer 22 over the modified layer 14. Metal film 21 is also deposited on a rear side of the substrate 10. A low temperature anneal (below 600 degrees Celsius) may be performed at this stage to promote good interface contact even though the deposited metal yields a good ohmic contact.

The ohmic contact formed according to the methodology of this embodiment realizes a substantial advantage for metal-oxide-semiconductor field-effect transistors (MOSFET) and insulated gate bipolar transistors (IGBTs), although not restricted to any particular device. It can be used for other devices such as photo-detectors, light emitting diodes (LEDs), laser diodes (LDs), p-n junctions (PNs), Schottky barrier diodes (SBDs), and static induction transistors (SITs) where the fabrication procedure consists of multi-step, which are sensitive to heat or the presence of the metal contact.

More particularly, in metal oxide semiconductor (MOS) based devices, the homoepitaxial film grown on the substrate and thermally grown oxides have an integral role in the device performance. Therefore, a lower anneal temperature is an advantage. In addition, the metal contact cannot be subjected to the oxidizing ambient that is required to grow the silicon carbide-silicon dioxide interface. Therefore, the ohmic contact must be realized at a low temperature after the thermal silicon dioxide is grown.

Prior art methods require an annealing temperature of about 800 degrees Celsius or greater (typically 1000 to 1050 degrees Celsius) to subsequently form the ohmic contact to the substrate. This high temperature process after the gate thermal oxide formation creates defects at the silicon carbide-silicon dioxide interface due to mismatches in the rate of thermal expansion. Therefore, by performing the multi-stage ohmic contact formation procedure, the methodology of the present embodiment provides a significant advantage in the manufacture and performance of the MOS based power devices.

Therefore, in the method according to the first embodiment, the modified silicon carbide layer 14 permits formation of the ohmic contact without requiring a high temperature annealing process or even at room-temperature.

Referring to FIGS. 7A–7L, a fourth embodiment will be discussed in which a metal-semiconductor contact for MOS based metal-oxide-semiconductor field-effect transistors (MOSFETs) and insulated gate bipolar transistors (IGBTs) is formed. This embodiment differs from the third embodiment in that a protective layer 30 is formed to protect the modified underlying silicon carbide from other device processing necessary for other component parts or to complete the semiconductor device.

Figure 7A:
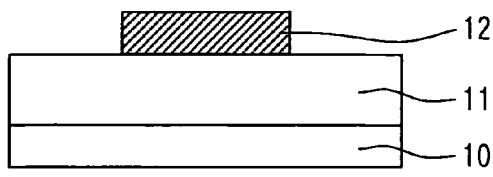
FIGS. 7A–7L show a method of forming an ohmic contact for a MOS based power device according to a fourth embodiment.
Figure 7B:
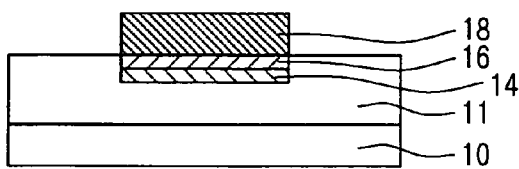

Similar to as shown in FIGS. 1A–1B of the first embodiment, here, as shown in FIGS. 7A–7B the transition metal group metal 12 is deposited on the substrate 10, and the substrate 10 is annealed at a high temperature to cause a solid state chemical reaction between the substrate 10 and the deposited metal 12 that forms a modified layer 14 in the substrate 10 having modified properties different than the substrate 10, and by-products comprised of a silicide 18 and a nanocrystalline graphite layer 16.

Figure 7C:
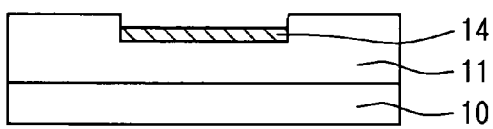

Referring to FIG. 7C, the substrate 10 is selectively etched to remove the by-products of the solid state chemical reaction from a surface of the substrate 10. More particularly, the silicide 18 and the nanocrystalline graphite layer 16 are removed. The selective etching may be performed by a treatment in liquid or gaseous etchants.

Figure 7D:
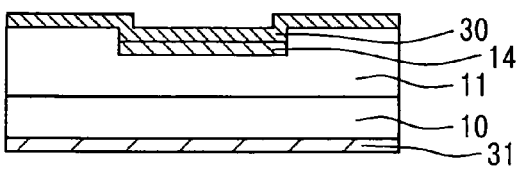
Figure 7E:
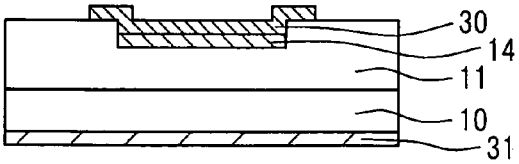

Referring to FIG. 7D, after selectively etching the substrate 10 to remove the silicide 18 and the nanocrystalline graphite layer 16, a protective layer 30 is deposited over the modified layer 14 and a rear surface of the substrate 10 and patterned as shown in FIG. 7E. The protective layer 30 may be composed of, for example, silicon nitride ($Si_3N_4$) which is commonly used in the LOCOS process of silicon power device technology.

Figure 7F:
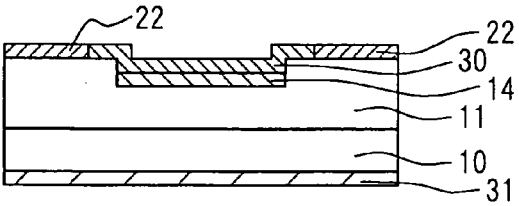

Referring to FIG. 7F, a gate thermal oxidation process is performed to grow a thermal oxide layer 22. The silicon nitride of the protective layer 30 generally does not oxidize in the thermal oxidation process. However, depending on condition, it is possible that 10% of the top surface may oxidize during the thermal oxidation process. A protective layer should be selected that is resistive to the thermal oxidation process.

Figure 7G:
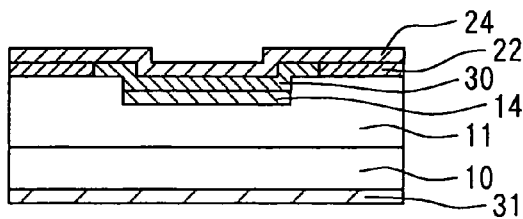
Figure 7H:
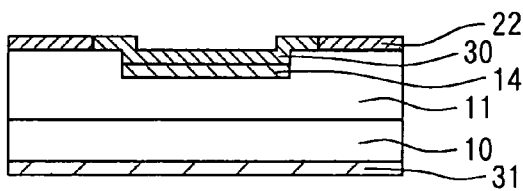

Referring to FIGS. 7G–7H, polysilicon 24 is deposited over the thermal oxide layer 22 and selectively removed for forming a gate. Also in FIGS. 7G–7H, although not shown, other device formation processes may be performed to form other component parts for the MOSFET or IGBT or to complete the semiconductor device.

Figure 7I:
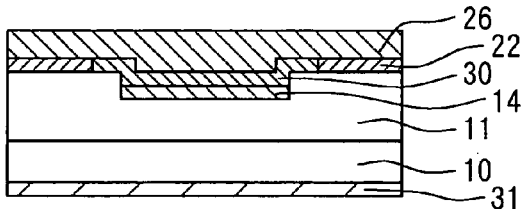
Figure 7J:
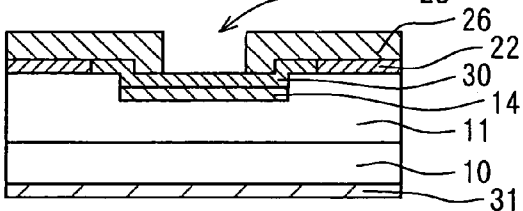
Figure 7K:
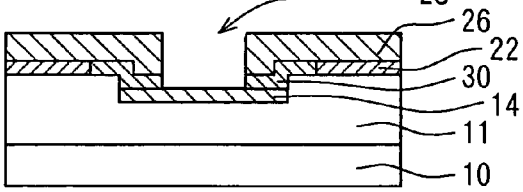
Figure 7L:
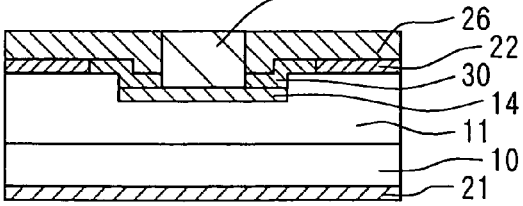

Referring to FIG. 7I a passivation layer 26 is deposited over the thermal oxide layer 22 and the protective layer 30. Referring to FIG. 7J, a contact hole 28 is formed in the passivation layer 26. As shown in FIG. 7K, the protective layer 30 is etched so that the contact hole 28 extends therethough to expose the modified layer 14. Finally, as shown in FIG. 7L, the metal film 20 is deposited in the contact hole 28 in the passivation layer 26 and the protective layer 30 to be over the modified layer 14. Metal film 21 is also deposited on a rear surface of the substrate 10. A low temperature anneal (below 600 degrees Celsius) may be performed at this stage to promote good interface contact even though the deposited metal yields a good ohmic contact.

Therefore, in the method according to this embodiment, the modified silicon carbide layer 14 permits formation of the ohmic contact without requiring a high temperature annealing process or even at room-temperature.

Referring to FIGS. 8A–8L, a fifth embodiment will be discussed in which a metal-semiconductor contact for MOS based metal-oxide-semiconductor field-effect transistors (MOSFETs) and insulated gate bipolar transistors (IGBTs) is formed. This embodiment differs from the third and fourth embodiments in that a protective layer 30 is formed to protect the modified underlying silicon carbide from other device processing necessary for other component parts or to complete the semiconductor device and that CVD oxide deposition or high-k dielectric oxide deposition is used to deposit a gate oxide layer 23.

Figure 8A:
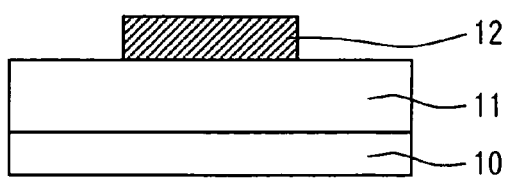
FIGS. 8A–8L show a method of forming an ohmic contact for a MOS based power device according to a fifth embodiment.
Figure 8B:
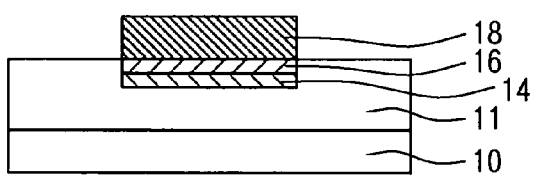

Similar to as shown in FIGS. 1A–1B of the first embodiment, here, as shown in FIGS. 8A–8B the transition metal group metal 12 is deposited on the substrate 10, and the substrate 10 is annealed at a high temperature to cause a solid state chemical reaction between the substrate 10 and the deposited metal 12 that forms a modified layer 14 in the substrate 10 having modified properties different than the substrate 10, and by-products comprised of a silicide 18 and a nanocrystalline graphite layer 16.

Figure 8C:
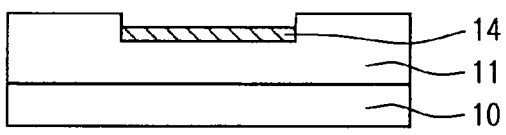

Referring to FIG. 8C, the substrate 10 is selectively etched to remove the by-products of the solid state chemical reaction from a surface of the substrate 10. More particularly, the silicide 18 and the nanocrystalline graphite layer 16 are removed. The selective etching may be performed by treatment in liquid or gaseous etchants.

Figure 8D:
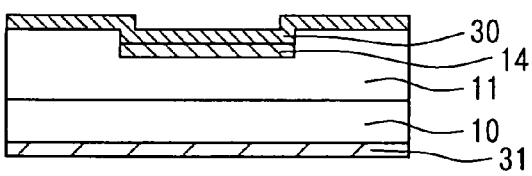

Referring to FIG. 8D, after selectively etching the substrate 10 to remove the silicide 18 and the nanocrystalline graphite layer 16, a protective layer 30 is deposited over the modified layer 14. Another protective layer 31 is also deposited on the reverse side of the substrate 10. As mentioned above, the protective layers 30, 31 may be composed of, for example, silicon nitride ($Si_3N_4$) which is commonly used in the LOCOS process of silicon power device technology.

Figure 8E:
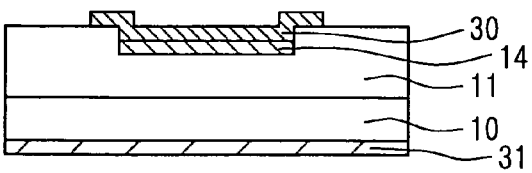
Figure 8F:
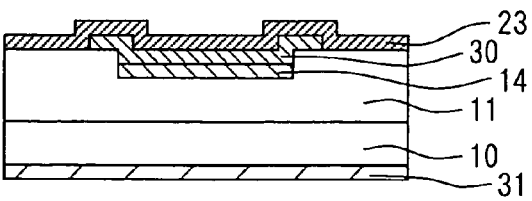
Figure 8G:
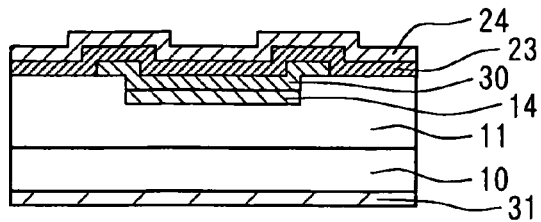
Figure 8H:
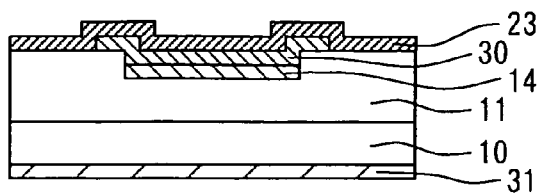

Referring to FIG. 8E, the protective layer 30 is patterned by conventional techniques. Referring to FIG. 8F, a gate CVD oxide or high-k dielectric oxide deposition process is performed to deposit a gate oxide 23 over the protective layer 30. Referring to FIGS. 8G–8H, polysilicon 24 is deposited over the gate oxide layer 23 and selectively removed for forming a gate.

Figure 8I:
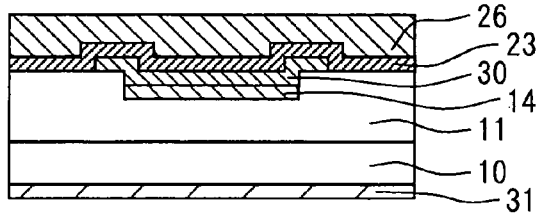
Figure 8J:
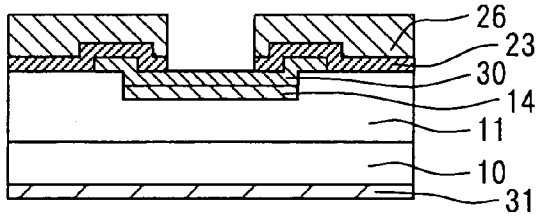
Figure 8K:
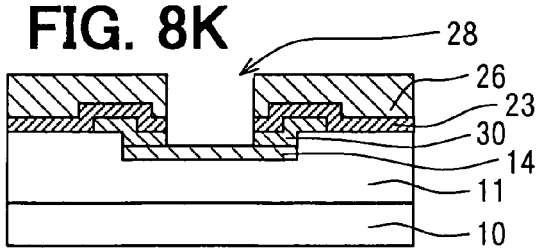
Figure 8L:
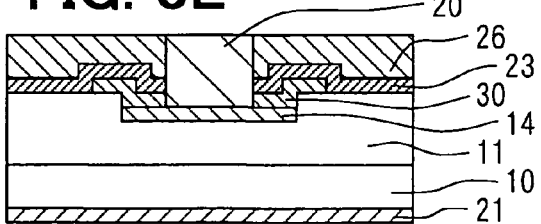

Referring to FIG. 8I a passivation layer 26 is deposited over the gate oxide layer 23 and the protective layer 30. Referring to FIG. 8J, a contact hole 28 is formed in the passivation layer 26 and the gate oxide layer 23. As shown in FIG. 8K, the protective layers 30 and 31 are etched so that the contact hole 28 extends therethough to expose the modified layer 14 and the protective layer 31 on the reverse side of the substrate 10 is removed. Finally, as shown in FIG. 8L, the metal film 20 is deposited in the contact hole 28 in the passivation layer 26 and the protective layer 30 to be over the modified layer 14. Metal film 21 is also deposited on a rear side of the substrate 10. A low temperature anneal (below 600 degrees Celsius) may be performed at this stage to promote good interface contact even though the deposited metal yields a good ohmic contact.

Also during the states of FIGS. 8D–8K, although not shown, other device formation for forming other component parts for the MOSFET or IGBT or to complete the semiconductor device may be performed.

Therefore, in the method according to this embodiment, the modified silicon carbide layer 14 permits formation of the ohmic contact without requiring a high temperature annealing process or even at room-temperature.

Therefore, the present disclosure concerns a method for forming an ohmic contact for a semiconductor device. The method generally includes: depositing a transition metal group metal 12 on a thin layer 11 of a silicon carbide substrate 10; annealing the substrate 10 at a high temperature to cause a solid state chemical reaction between the substrate 10 and the deposited metal 12 that forms a modified layer 14 in the substrate 10 having modified properties different than the substrate 10, and by-products comprised of a silicide 18 and a nanocrystalline graphite layer 16; selectively etching the substrate 10 to remove one or more of the by-products of the solid state chemical reaction from a surface of the substrate 10; performing a device formation process in the substrate; depositing a metal film 20 comprised of a transition group metal over the modified layer 14 on the substrate 10 to form the ohmic contact. The modified layer 14 permits formation of the ohmic contact without high temperature annealing after depositing the metal film 20. More particularly, the modified layer 14 permits depositing the metal film 20 at room temperature.

The device formation process comprises forming a MOSFET or IGBT in the substrate. For example, a thermal oxide growth process for forming a gate for the MOSFET or IGBT.

The above embodiments are merely described for the purpose of exemplification of the present invention, and the present invention is not limited to these embodiments. Accordingly, various modifications may be made based on the knowledge of persons skilled in the art to the above embodiments without departing from the subject matter of the present invention.

The invention claimed is:

1. A method of forming an ohmic contact on a substrate comprised of a wide-band gap semiconductor material, the method comprising:
    depositing a transition metal group metal on the substrate;
    annealing the substrate at a high temperature to cause a solid state chemical reaction between the substrate and the deposited metal that forms a modified layer in the substrate having modified properties different than the substrate, and by-products comprised of a silicide and a nanocrystalline graphite layer;
    selectively etching the substrate to remove one or more of the by-products of the solid state chemical reaction from a surface of the substrate, wherein the selective etching of the substrate to remove the one or more of the by-products of the solid state chemical reaction further comprises removing only the silicide; and
    depositing a metal film comprised of another metal over the modified layer on the substrate to form the ohmic contact, wherein the modified layer permits formation of the ohmic contact without high temperature annealing after depositing the metal film.

2. The method of claim 1, wherein the depositing of the metal film over the modified layer to form the ohmic contact further comprises depositing the metal film on the nanocrystalline graphite layer that is one of the by-products of the solid state chemical reaction.

3. The method of claim 1, further comprising:
    after selectively etching the substrate to remove only the silicides, performing a gate thermal oxidation process to grow a thermal oxide layer over the modified layer, thereby removing the nanocrystalline graphite layer;
    wherein the depositing of the metal film over the modified layer further comprises depositing the metal film in a contact hole in the thermal oxide layer.

4. The method of claim 3, wherein the gate thermal oxidation process further comprises:
    forming a contact area by depositing polysilicon over the thermal oxide layer and selectively removing the polysilicon; and
    depositing a passivation layer over the thermal oxide layer; and
    forming the contact hole in the passivation layer and the thermal oxide layer to expose the modified layer.

* * * * *